United States Patent
Chen et al.

(10) Patent No.: US 11,611,058 B2
(45) Date of Patent: Mar. 21, 2023

(54) DEVICES AND SYSTEMS FOR UNDER DISPLAY IMAGE SENSOR

(71) Applicant: Apple Inc., Cupertino, CA (US)

(72) Inventors: Yuan Chen, Campbell, CA (US); Chia Hsuan Tai, San Jose, CA (US); Mohammad Yeke Yazdandoost, Santa Clara, CA (US); Zhibing Ge, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 288 days.

(21) Appl. No.: 17/003,732

(22) Filed: Aug. 26, 2020

(65) Prior Publication Data

US 2021/0091342 A1    Mar. 25, 2021

Related U.S. Application Data

(60) Provisional application No. 62/905,355, filed on Sep. 24, 2019.

(51) Int. Cl.
*H01L 51/52* (2006.01)
*H01L 27/32* (2006.01)
*G06F 1/16* (2006.01)

(52) U.S. Cl.
CPC ........ *H01L 51/5281* (2013.01); *G06F 1/1609* (2013.01); *G06F 1/1626* (2013.01); *H01L 27/3227* (2013.01); *H01L 27/3232* (2013.01)

(58) Field of Classification Search
CPC ............. H01L 51/5281; H01L 27/3227; H01L 27/3232; H01L 27/323; G06F 1/1609;
(Continued)

(56) References Cited

U.S. PATENT DOCUMENTS 5,231,689 A    7/1993    Reidinger
6,349,159 B1    2/2002    Uebbing et al.
(Continued)

FOREIGN PATENT DOCUMENTS

CN    105531653    4/2016
CN    107180853    9/2017
(Continued)

OTHER PUBLICATIONS

Gelinck et al., "X-Ray Detector-on-Plastic With High Sensitivity Using Low Cost, Solution-Processed Organic Photodiodes," IEEE, 2015, pp. 1-8.
(Continued)

*Primary Examiner* — Donald L Raleigh
(74) *Attorney, Agent, or Firm* — Brownstein Hyatt Farber Schreck, LLP

(57) ABSTRACT

An optical system is described. The optical system may include a sensor which may be in a mobile device. The optical system may use the same light source for imaging the display and for providing light to a sensor or sensor device. The optical system may be configured so that randomly polarized light will exit the device for viewing so that a user may view the display in any rotated orientation while wearing polarized eyewear. The optical system may further be configured to mitigate reflections in the mobile device from ambient light entering the system and from reflected and backscattered light from cross-contaminating the imaging light of the display.

20 Claims, 8 Drawing Sheets

(58) Field of Classification Search
CPC .............. G06F 1/1626; G06V 40/1318; G06V 40/1324; G06V 10/147; G06V 40/166; G02B 27/286; G02B 5/3025; G02B 5/3083
See application file for complete search history.

(56) References Cited

U.S. PATENT DOCUMENTS

| | | | |
|---|---|---|---|
| 6,529,661 B2 | 3/2003 | Kropp | |
| 6,556,349 B2 | 4/2003 | Cox et al. | |
| 6,586,776 B1 | 7/2003 | Liu | |
| 6,910,812 B2 | 6/2005 | Pommer | |
| 6,919,681 B2 | 7/2005 | Cok et al. | |
| 6,946,647 B1 | 9/2005 | O'Neill et al. | |
| 6,948,820 B2 | 9/2005 | Veligdan et al. | |
| 7,021,833 B2 | 4/2006 | Loh | |
| 7,444,083 B2 | 10/2008 | Ohashi et al. | |
| 7,495,272 B2 | 2/2009 | Maruyama et al. | |
| 7,499,094 B2 | 3/2009 | Kuriyama | |
| 7,518,462 B2 | 4/2009 | Kanno et al. | |
| 7,706,073 B2 | 4/2010 | Munro | |
| RE41,673 E | 9/2010 | Ma | |
| 7,842,246 B2 | 11/2010 | Wohlstadter et al. | |
| 8,077,393 B2 | 12/2011 | Steenblik | |
| 8,305,400 B2 | 11/2012 | Otani | |
| 8,310,413 B2 | 11/2012 | Fish et al. | |
| 8,603,642 B2 | 12/2013 | Hatwar et al. | |
| 8,625,058 B2 | 1/2014 | Kozuma et al. | |
| 8,664,655 B2 | 3/2014 | Lee et al. | |
| 8,743,027 B2 | 6/2014 | Wu et al. | |
| 8,780,065 B2 | 7/2014 | Ribeiro et al. | |
| 9,007,349 B2 | 4/2015 | Tseng | |
| 9,064,451 B2 | 6/2015 | Lynch et al. | |
| 9,070,648 B2 | 6/2015 | de Jong et al. | |
| 9,112,043 B2 | 8/2015 | Arai | |
| 9,183,779 B2 | 11/2015 | Soto | |
| 9,342,181 B2 | 5/2016 | Wyatt et al. | |
| 9,530,381 B1 | 12/2016 | Bozarth et al. | |
| 9,570,002 B2 | 2/2017 | Sakariya et al. | |
| 9,614,168 B2 | 4/2017 | Zhang et al. | |
| 9,633,247 B2 | 4/2017 | Pope et al. | |
| 9,741,286 B2 | 8/2017 | Sakariya et al. | |
| 9,762,329 B2 | 9/2017 | Motohara | |
| 9,836,165 B2 | 12/2017 | Nho et al. | |
| 9,870,075 B2 | 1/2018 | Han et al. | |
| 9,909,862 B2 | 3/2018 | Ansari et al. | |
| 9,947,901 B2 | 4/2018 | Shedletsky et al. | |
| 10,073,228 B2 | 9/2018 | Polleux et al. | |
| 10,079,001 B2 | 9/2018 | Hodges | |
| 10,090,574 B2 | 10/2018 | Wu | |
| 10,115,000 B2 | 10/2018 | Mackey et al. | |
| 10,222,475 B2 | 3/2019 | Pacala | |
| 10,290,266 B2 | 5/2019 | Kurokawa | |
| 10,331,939 B2 | 6/2019 | He et al. | |
| 10,345,905 B2 | 7/2019 | McClure et al. | |
| 10,410,036 B2 | 9/2019 | He et al. | |
| 10,410,037 B2 | 9/2019 | He et al. | |
| 10,453,381 B2 | 10/2019 | Kurokawa | |
| 10,474,286 B2 | 11/2019 | Bae et al. | |
| 10,551,662 B2 | 2/2020 | Kimura et al. | |
| 10,565,734 B2 | 2/2020 | Bevensee et al. | |
| 10,614,279 B2 | 4/2020 | Kim et al. | |
| 10,637,008 B2 | 4/2020 | Harada et al. | |
| 10,664,680 B2 | 5/2020 | Xu et al. | |
| 10,713,458 B2 | 7/2020 | Bhat et al. | |
| 10,748,476 B2 | 8/2020 | Zhao et al. | |
| 10,809,853 B2 | 10/2020 | Klenkler et al. | |
| 10,838,556 B2 | 11/2020 | Yeke Yazdandoost et al. | |
| 10,840,320 B2 | 11/2020 | Yazdandoost et al. | |
| 10,872,222 B2 | 12/2020 | Gao et al. | |
| 10,903,901 B2 | 1/2021 | Mitchell | |
| 10,950,592 B2 | 3/2021 | Ding et al. | |
| 10,978,523 B2 | 4/2021 | Park et al. | |
| 2003/0148391 A1 | 8/2003 | Salafsky | |
| 2004/0209116 A1 | 10/2004 | Ren et al. | |
| 2005/0094931 A1 | 5/2005 | Yokoyama et al. | |
| 2010/0302185 A1* | 12/2010 | Han | G06F 3/0425 345/173 |
| 2011/0176086 A1 | 7/2011 | Katoh et al. | |
| 2012/0113357 A1 | 5/2012 | Cheng et al. | |
| 2013/0113733 A1 | 5/2013 | Lim et al. | |
| 2015/0309385 A1 | 10/2015 | Shu et al. | |
| 2017/0242506 A1 | 8/2017 | Patel et al. | |
| 2017/0270342 A1 | 9/2017 | He et al. | |
| 2018/0032778 A1 | 2/2018 | Lang | |
| 2018/0323243 A1 | 11/2018 | Wang | |
| 2019/0034686 A1 | 1/2019 | Ling et al. | |
| 2019/0130155 A1 | 5/2019 | Park | |
| 2019/0221624 A1 | 7/2019 | Lin et al. | |
| 2019/0293849 A1 | 9/2019 | Du et al. | |
| 2020/0051499 A1 | 2/2020 | Chung et al. | |
| 2020/0209729 A1 | 7/2020 | Chen et al. | |
| 2020/0241138 A1 | 7/2020 | Allen et al. | |
| 2020/0265206 A1 | 8/2020 | Chung et al. | |
| 2020/0293741 A1 | 9/2020 | Du | |
| 2020/0342194 A1 | 10/2020 | Bhat et al. | |
| 2021/0014429 A1 | 1/2021 | Alasirnio et al. | |
| 2021/0050385 A1 | 2/2021 | Chuang et al. | |
| 2021/0064159 A1 | 3/2021 | Yeke Yazdandoost et al. | |
| 2021/0089741 A1 | 3/2021 | Yeh et al. | |
| 2021/0255668 A1 | 8/2021 | Xiang et al. | |
| 2021/0287602 A1 | 9/2021 | Chen et al. | |
| 2021/0396935 A1 | 12/2021 | Chen et al. | |
| 2022/0035200 A1 | 2/2022 | Chen et al. | |
| 2022/0158141 A1* | 5/2022 | Yuki | H05B 33/12 |

FOREIGN PATENT DOCUMENTS

| | | |
|---|---|---|
| CN | 107271404 | 10/2017 |
| CN | 107330426 | 11/2017 |
| CN | 107515435 | 12/2017 |
| CN | 108292361 | 7/2018 |
| CN | 108885693 | 11/2018 |
| CN | 109074475 | 12/2018 |
| CN | 109791325 | 5/2019 |
| CN | 109983471 | 7/2019 |
| DE | 202004002512 | 3/2005 |
| EP | 2463927 | 8/2013 |
| EP | 3171254 | 5/2017 |
| EP | 3404484 | 11/2018 |
| EP | 3438880 | 2/2019 |
| JP | H0642898 | 2/1994 |
| JP | 6127447 | 5/2017 |
| KR | 20050022260 | 3/2005 |
| WO | WO 17/204777 | 11/2017 |
| WO | WO 18/093798 | 5/2018 |
| WO | WO 18/186580 | 10/2018 |
| WO | WO 18/210317 | 11/2018 |

OTHER PUBLICATIONS

Garcia de Arquer et al., "Solution-processed semiconductors for next-generation photodetectors," *Nature Reviews—Materials*, 2017, vol. 2, No. 16100, pp. 1-16.
International Search Report and Written Opinion dated Oct. 28, 2020, PCT/US2020/048259, 11 pages.
U.S. Appl. No. 17/865,169, filed Jul. 14, 2022, Medower et al.
U.S. Appl. No. 16/376,987, filed Apr. 5, 2019, Yeke Yazdandoost et al.
U.S. Appl. No. 16/791,905, filed Feb. 14, 2020, Xiang.
U.S. Appl. No. 16/815,875, filed Mar. 11, 2020, Chen et al.
U.S. Appl. No. 16/905,664, filed Jun. 18, 2020, Chen et al.
U.S. Appl. No. 16/945,643, filed Jul. 31, 2020, Chuang et al.
U.S. Appl. No. 16/945,174, filed Jul. 31, 2020, Chen et al.
U.S. Appl. No. 17/003,636, filed Aug. 26, 2020, Yeh et al.
U.S. Appl. No. 17/006,708, filed Aug. 28, 2020, Ran et al.
U.S. Appl. No. 17/028,775, filed Sep. 22, 2020, Yeke Yazdandoost et al.

(56) References Cited

OTHER PUBLICATIONS

U.S. Appl. No. 17/200,683, filed Mar. 12, 2021, Einzinger et al.
U.S. Appl. No. 17/466,813, filed Sep. 3, 2021, Vulis et al.

* cited by examiner

DEVICES AND SYSTEMS FOR UNDER DISPLAY IMAGE SENSOR

CROSS-REFERENCE TO RELATED APPLICATION

This application is a nonprovisional of and claims the benefit under 35 U.S.C. 119(e) of U.S. Provisional Patent Application No. 62/905,355, filed Sep. 24, 2019, the contents of which are incorporated herein by reference as if fully disclosed herein.

FIELD

Embodiments described herein relate generally to mobile devices with a sensor and/or a sensor array, and more particularly to depolarizing light for viewing purposes and to allow reflected light to reach the sensor and/or the sensor array.

BACKGROUND

Mobile devices may be used by any person in various locations such as inside buildings and outside, at varying times during the day, including the morning, day, and evening. During some periods of the day a user may be viewing the screen of the mobile device outside and while wearing sunglasses. Some of these sunglasses may have polarized lenses which may make viewing the mobile device screen difficult. Additionally, in some examples, the user may be viewing the screen of the mobile device through a polarizing film, a polarizing sheet, a polarizing layer, or a polarizing film on glass. In any of these examples, the user may have difficulty viewing the screen of the mobile device in various orientations.

SUMMARY

Embodiments of the systems, devices, methods, and apparatus described in the present disclosure are directed to a mobile device with sensors and/or a sensor array. Also described are systems, devices, methods, and apparatus directed to a mobile device which may be viewed through a polarizing layer when the device is in either landscape or portrait mode.

In some examples, the present disclosure describes a sensing device, which may include a reflective element, a first optical retardance element which may be configured to receive depolarized light from the reflective element along an optical path, a polarizing element which may be configured to receive the light from the first optical retardance element along the optical path, a second optical retardance element which may be configured to receive light from the polarizing element along the optical path, where the first optical retardance element has a higher retardance than the second optical retardance element, and a sensor array which may be configured to receive light along the optical path and to receive light after the light has passed through the second optical retardance element, where the sensor array may be further configured to sense light used to determine physiological information of a user. In some examples, the first optical retardance element may be configured to transmit depolarized light to the reflective element along a second optical path and may be configured receive depolarized and reflected light from a finger of the user along the optical path. Also, in some examples, the first optical retardance element may have a retardance value greater than 1000 nanometers and in some examples, may have a retardance value equal to or greater than 8000 nanometers. Additionally, in some examples, the first optical retardance element may be further configured to receive polarized light from the polarizing element along a second optical path and to transmit the randomly polarized light toward a reflective element along the second optical path.

In some examples, the sensing device may include an organic light emitting diode which may be configured to receive light from the second optical retardance element and to transmit light to the sensor array. In some examples, the polarizing element of the sensing device may be configured to absorb light at a 45 degree angle to the horizontal axis. In still further examples, the reflective element may be sapphire.

In some examples, the present disclosure describes an optical system which may include a light emitting layer which may be configured to emit light toward a polarizing layer along a first optical path, where the polarizing layer may be configured to polarize light and transmit the polarized light toward an optical depolarization layer along the first optical path, and the optical depolarization layer may be configured to randomly polarize the received polarized light and transmit the randomly polarized light toward at least a protective layer along the first optical path. In some examples, the optical system may include a sensor array which may be configured to receive light from the optical depolarization layer along a second optical path, where the received light may be used for determining physiological information of a user. In some examples, the optical depolarization layer may have a retardance of at least 8000 nanometers. In some examples, the protective layer may be configured to reflect the randomly polarized light to the optical depolarization layer and the optical depolarization layer may be configured to receive reflected randomly polarized light from a finger of a user and along a second optical path. In still further examples, the optical depolarization layer is at least one of polyethylene terephthalate (PET) or polyethylene naphthalate (PEN).

In some examples, the optical system may include an optical retardance layer disposed between the light emitting layer and the polarizing layer. In some examples, the polarizing layer of the optical system may be configured to receive randomly polarized light from the optical retardance layer along the second optical path. In further examples, the light emitting layer of the optical system may be an organic light emitting diode configured to emit light, where the emitted light may be used for determining physiological information of a user.

In some examples, the present disclosure describes a mobile device which may include a cover glass disposed in an optical path, and an optical stack adjacent to the cover glass and disposed in the optical path. In some examples, the optical stack may include a first optical retarder which may be disposed in the optical path and may be configured to randomly polarize light, a polarizer disposed in the optical path, and a second optical retarder which may be disposed in the optical path. The mobile device may also include a display layer adjacent to the sensing layer and may be disposed in the optical path, and a sensing layer which may be disposed in the optical path and which may be configured to sense light received in the optical path, where the sensing layer may be further configured to use the sensed light for determining physiological information of a user. In some examples, the first optical retarder may be configured to receive polarized light from the polarizer and to randomly polarize the received polarized light and may have a retardance value equal to or greater than 8000 nanometers.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1A:
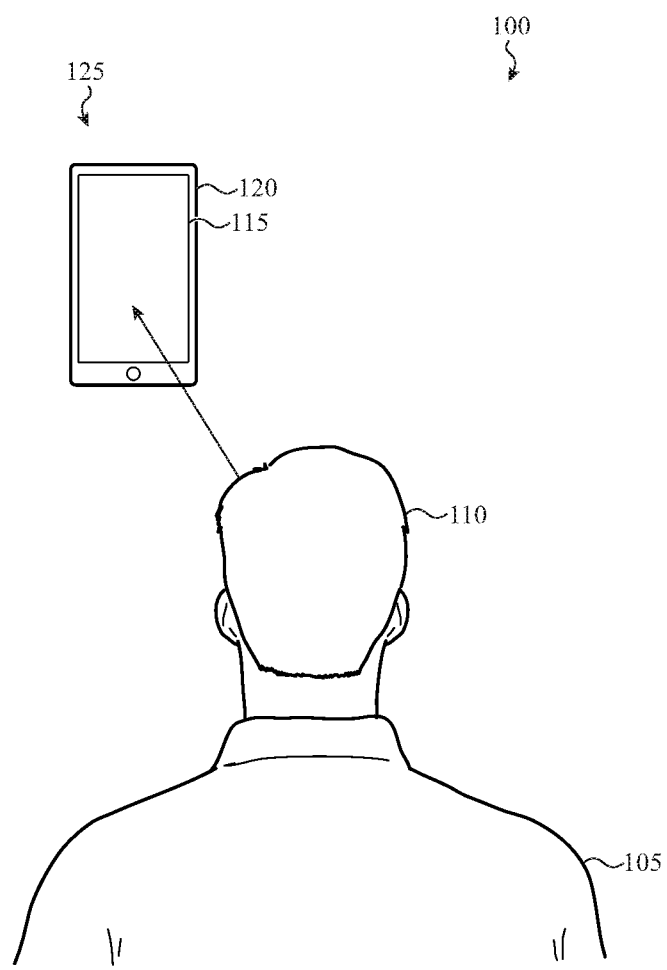
FIG. 1A illustrates an example of a user viewing a mobile device.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented between them, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

Generally, people may use mobile devices in any number of environments. Some users may utilize mobile devices outside and may be wearing sunglasses when viewing the mobile device's screen. In some cases, the sunglasses and mobile device's screen may have the same polarization. For example, both may be linearly polarized or both may be circularly polarized. Although the user may have the ability to view the mobile device screen in, for example, portrait mode, once the mobile device is rotated to landscape mode, due to cross-polarization, the mobile device screen may appear dark or black, and the user may have to remove their sunglasses to view the screen. Although the user may view the screen without sunglasses, it may be difficult to rotate the screen, remove sunglasses, or otherwise easily interact with the device in some situations (such as when the user's hands are full or otherwise busy).

Further, various biometric information, such as a user fingerprint or facial recognition, may be used by the mobile device as a security measure. The biometric information may be used on the mobile device to unlock the device for use or in verifying authentication of a purchase, and so forth. In some examples, it may be useful to incorporate the use of biometric authentication information into a mobile device which may be viewed while wearing sunglasses or any other type of polarized eyewear.

Alternatively and as discussed herein, mobile devices may implement various features by allowing a user to view the mobile device screen, regardless of the orientation of the mobile device screen, while wearing polarized eyewear and by incorporating a sensor in the mobile device. The user may also be capable of viewing the mobile device screen in the presence of any type of linearly polarized film, linearly polarized sheet, linearly polarized coating on glass, or any other linearly polarized element between the mobile device screen and the user viewing the screen.

The mobile device may be any type of device including, but not limited to, a mobile phone, a smart phone, a watch, a tablet, a laptop, and so forth. In some examples, the mobile device may also be a sensing device. The sensing device may include a reflective element, optical elements, and a sensor array along an optical path. The reflective element may depolarize or randomly polarize or depolarize any light reflected off the surface of the reflective element. For example, polarized light incident on the surface of the reflective element may be reflected and the reflected light from the surface may be randomly polarized. The terms randomly polarized and depolarized may be used interchangeably herein. Additionally, randomly polarized light incident on the surface of the reflective element may be reflected as randomly polarized light. In some examples, the optical elements may be configured to reduce reflections so that content on the display of the mobile device is more easily visible to a user, and additionally to allow reflected light to reach the sensor array.

In some examples, the optical elements may include a first optical retardance element, a polarizing element, and a second optical retardance element, where the first and second optical retardance elements may have different retardance values. With the inclusion of these optical elements, a mobile device may be capable of using the display light source as the light source for the sensor as well. Further, the optical elements may allow a user to view the mobile device screen while wearing polarized eyewear, even when the mobile device screen is rotated in any orientation, for example, from landscape to portrait orientation (or vice versa). Additionally, the optical elements may mitigate optical artifacts resulting from light internally reflecting off elements of the mobile device display stack.

In some examples, light may be emitted from a light emitting layer and may pass through a first optical retardance element and then may pass through a polarizing element. The polarizing element may polarize the light, for example with a p-polarization state. The polarized light may then pass through a second optical retardance element with a high retardance value, for example greater than 1000 nanometers. The second optical retardance element may depolarize the received polarized light. The depolarized light may be passed to a reflective element such as a cover glass and at least some of the depolarized light may be reflected back. In some examples, at least a portion of the depolarized light may be additionally reflected back by a user's finger. The reflected light may be reflected at least partially back towards the second optical retardance element and, after passing through the second optical retardance element, the light may still be depolarized. The terms randomly polarized and depolarized may be used interchangeably herein. The randomly polarized light may then pass to the polarization element. Because the light is randomly polarized, it may exit the polarization element as linearly polarized light. The polarized light may pass through the first optical retardance element, thereby becoming circularly polarized light, may pass through the light emitting element, and then may be received by the sensing element or sensing array. In some examples, the light received at the sensing element or sensing array may be used to determine biometric data of the user. In some examples, reflected light may be absorbed or stopped at the polarization layer and the quality of the image on the mobile device screen may be better due to the mitigated cross-contamination of light emitted from the display layer and the circularly polarized light reflected off the sensor array which will be discussed in further detail with respect to FIGS. 1A-3.

Described herein are various configurations for using optical elements to enable a mobile device to use a light source for the display and for the sensor as well. In some embodiments, the optical elements may enable a user to view the mobile device screen in any orientation while wearing polarized eyewear.

These and other embodiments are discussed below with reference to FIGS. 1A-6. However, those skilled in the art will readily appreciate that the detailed description given herein with respect to these figures is for explanatory purposes only and should not be construed as limiting.

Figure 1B:
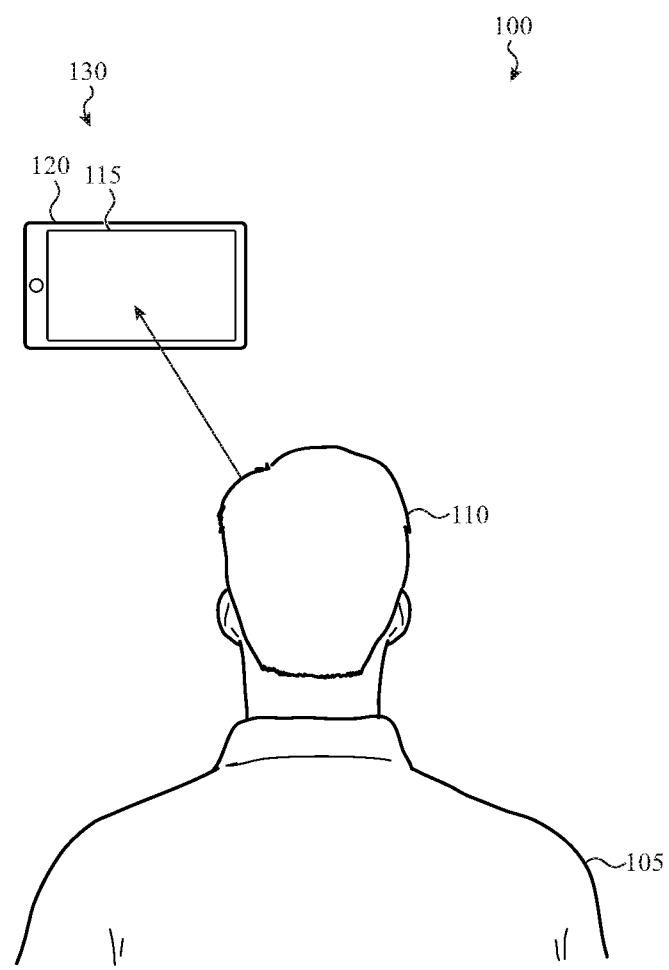
FIG. 1B illustrates an example of a user viewing a mobile device.

FIGS. 1A and 1B illustrate an example 100 of a user viewing a mobile device. In some examples, the user 105 may be wearing sunglasses 110 while viewing the screen 115 of the mobile device 120. The mobile device 120 may be any type of device including, but not limited to, a mobile phone, a smart phone, a watch, a tablet, a biometric monitoring or sensing device such as a heart rate monitor, a GPS device, a laptop, and so forth. In some examples, the mobile device may also be a sensing device with the capability of sensing biometric or physiological data of a user.

As illustrated in FIG. 1A, the user 105 may be wearing sunglasses 110 to view the mobile device screen 115. In many situations a user may rotate the mobile device 120 in order to change an orientation of information shown on the device screen 115. For example, a user may wish to view content in a landscape or portrait mode, or capture an image or video in a corresponding mode. The user 105 may rotate the mobile device 120 from being vertical or in portrait position or mode 125 as illustrated in FIG. 1A to being horizontal or in landscape position or mode 130 as illustrated in FIG. 1B and may be capable of viewing the mobile device screen 115 in both FIGS. 1A and 1B.

Upon rotation of the mobile device, the screen 115 of the mobile device will change orientation as well. In some examples, the sunglasses 110 may have linearly polarized lenses. In some examples, the issue may arise when viewing mobile device screens with a polarized lens, the user 105 may be able to view the mobile device screen 115 when it is in portrait orientation 125, but the screen may appear to be dark or black once the mobile device is rotated to be in landscape orientation 130 or vice versa. In some examples, the issue may arise when the user may be able to view the mobile device screen 115, in portrait orientation 125 or landscape orientation 130, but the image quality may be degraded due to being dark or a color error such as color fringing or a color shift may be introduced with rotation of the mobile device between the orientations. The orientation and color shift issues may be addressed by introducing a high retardance film to depolarize the light before the light exits the mobile device.

As discussed herein in FIGS. 1A-7, the user 105 may be wearing polarized eyewear or there may be a polarizing film between the user 105 and the mobile device screen 115 and the user 105 may be capable of viewing the mobile device screen 115 in both portrait and landscape positions. Further, in some examples, the mobile device screen may emit light which may not be linearly polarized, thus allowing for the user 105 to view the mobile device screen in any orientation. The mobile device screen, in some examples, may emit light which may be circularly polarized, elliptically polarized, partially polarized, or randomly polarized.

Additionally, the mobile device 120 may be capable of sensing user biometric data such as a user fingerprint on the screen 115. In some examples, the mobile device 120 may use the light emitted from the display layer as the light source for the sensing function. The mobile device 120 may include a display layer which may emit light to produce the images on the mobile device screen, and which may also function as the light source for reflecting light from the finger of a user to sense user fingerprint data. In this example, the light may propagate along an optical path from the display layer, through the optical elements along the optical path, and also through the cover glass along the optical path and may reflect off of the user's finger back through the cover glass. The reflected light may then pass back through all of the optical elements, through the display layer and to the sensor element along a return optical path. In some examples, the optical path may be in a first direction and the return optical path may be in a second direction. For example, the optical path may include a path from the light source to the reflective elements such as the cover glass or user's finger and the return optical path may include a path from the cover glass or user's finger to the sensor array. In some examples, either of the optical path and/or the return optical path may be referred to herein as a first optical path and a second optical path. Further, an optical path may be a path along which optical elements may be located and the term optical path may be used interchangeably with the term light path. In some examples, light may propagate along either of the optical path or light path and may pass through the optical elements in either direction. In some examples, the sensor element may be a sensor array. The cover glass may be at least partially reflective and partially transmissive of the light. The optical elements which may allow the light to pass through in two different directions or along two different light paths will be discussed in further detail herein.

Figure 2:
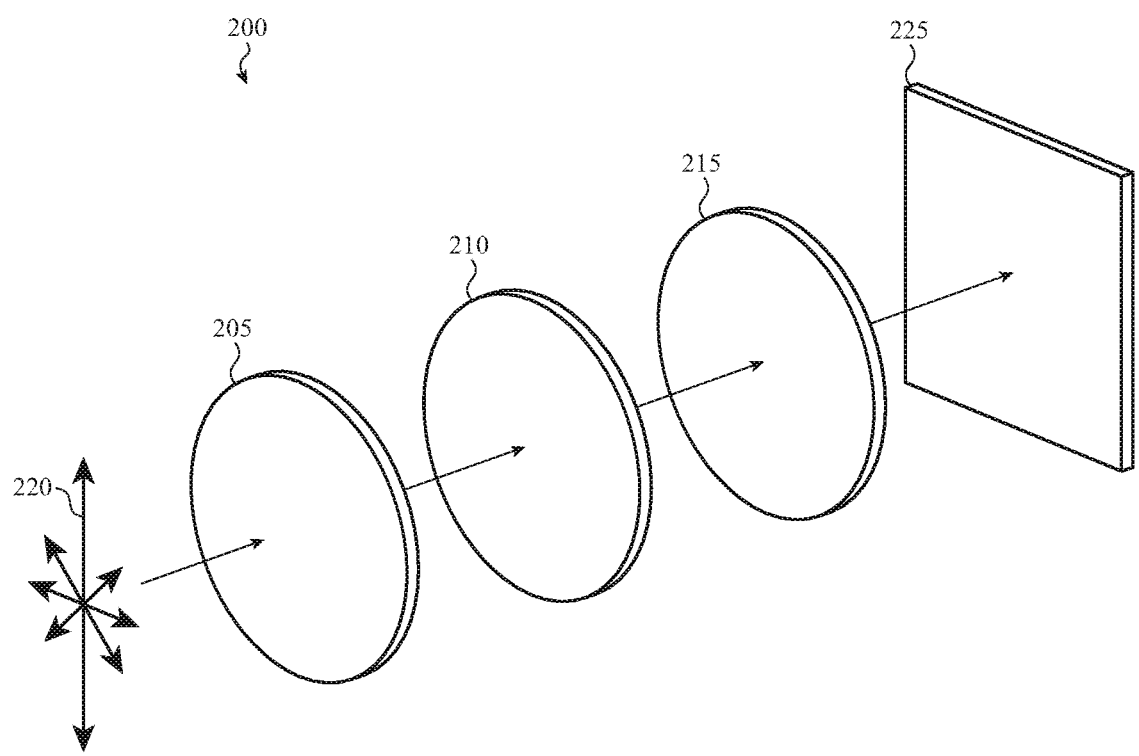
FIG. 2 illustrates an example layout of an optical system.

FIG. 2 illustrates an example layout of an optical system 200. In some examples, the optical system 200 may include a first optical retardance element 205, a polarization element 210, a second optical retardance element 215, and a reflective element 225 located along an optical path. The optical elements of the optical system 200 may be included in the mobile device of FIG. 1. Additionally and as depicted in FIG. 2, randomly polarized light may be provided to the optical system 200.

As illustrated in FIG. 2, the optical system 200 may depict a light path or optical path with light propagating from a randomly polarized light source 220 through the optical elements of the optical system 200. In FIG. 2, the first optical retardance element 205 may be an optical retarder configured as a quarter-wave plate. Generally, optical retarders may be optical plates with different amounts of birefringence and may be used in altering the polarization states of light. The terms wave plate, optical retarder, and optical retardance element may be used interchangeably herein. The randomly polarized light may be transmitted to the first optical retardance element 205 and the randomly polarized light may propagate through the optical retardance element 205 and may exit also as randomly polarized light.

The randomly polarized light may be transmitted from the first optical retardance element 205 to the polarization element 210. The polarization element 210 of FIG. 2 may linearly polarize the randomly polarized light when the light passes through the polarization element 210. As shown in FIG. 2, the linearly polarized light may be a horizontal polarization state, vertical polarization state, linearly polarized at a 45 degree angle, or any other appropriate angle of linear polarization. The linearly polarized light may then be transmitted to the second optical retardance element 215.

In some examples, the second optical retardance element 215 may have a different retardance value than the first optical retardance element 205. In some examples, the second optical retardance element 215 may have a retardance value Re of greater than approximately 1000 nanometers, and in some cases greater than 8000 nanometers. The retardance value of the second optical retardance element 215 may be discussed in further detail herein. The polarized light may pass through the second optical retardance element 215 and the polarized light may be randomly polarized by the second optical retardance element 215. The randomly polarized light may then be transmitted to the reflective element 225. Although a retardance element is described as the depolarizing element in the optical system 200, other types of depolarization plates or layers may be employed in this system, such as a diffuser. The reflective element 225 may receive the randomly polarized light from the second optical retardance element 215 and may reflect randomly polarized light back towards the second optical retardance element 215. The light path or optical path from the reflective element back through the optical system will be discussed in further detail herein.

Figure 3:
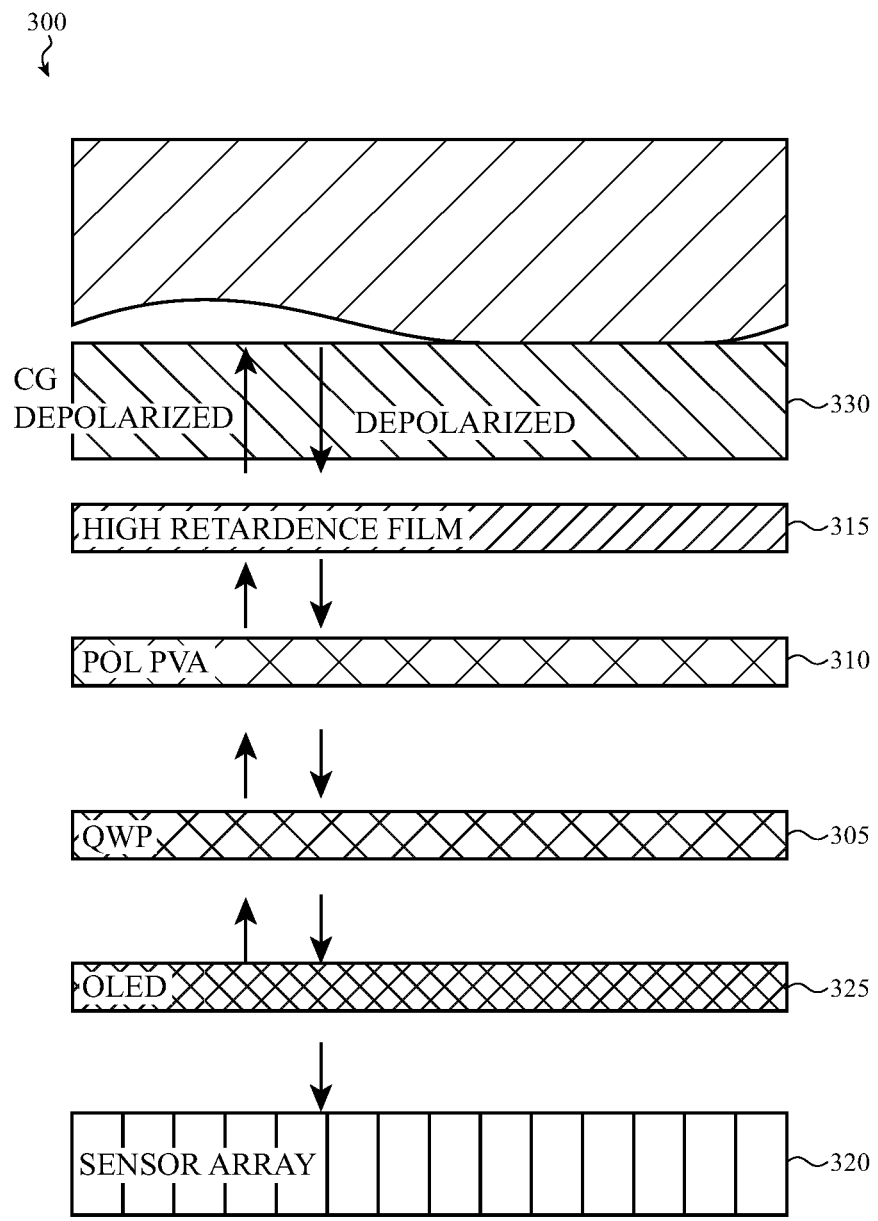
FIG. 3 illustrates an example layout of an optical system.

FIG. 3 illustrates an example layout of an optical system and illustrates a cross-section of the mobile device 120 of FIG. 1. In some examples, the optical system 300 may be an optical stack and may include a sensor array 320, a display layer 325, a first optical retardance element 305, a polarization element 310, a second optical retardance element 315, and a reflective element 330. The optical elements of the optical system 300 may be included in the mobile device of FIG. 1. Additionally, some of the optical elements are similarly numbered such as first optical retardance element 305 of FIG. 3 and first optical retardance element 205 of FIG. 2 and in some examples may share similar properties. In FIG. 3, the elements are not drawn to scale and may be thicker or thinner than depicted. Additionally, the elements of FIG. 3 are depicted with spaces in between each of the elements. In the mobile device, the elements of FIG. 3 may or may not be spaced apart. In the example in which the elements are spaced apart, the spaces by which the elements are separated may be equal or different.

A mobile device that includes the optical system 300 may allow a user with polarized eyewear to view the screen of the mobile device regardless of the orientation of the screen. For example, the user with polarized eyewear may rotate the mobile device between portrait and landscape orientations and may still be able to see the screen while wearing the polarized eyewear. Further, the mobile device that includes the optical system 300 may additionally be capable of sensing a user fingerprint on the screen of the mobile device. These capabilities will be discussed in further detail herein.

As illustrated in FIG. 3, the optical system 300 may depict a first optical path which may propagate from the display layer 325, through the optical elements, to the reflective element 330 and a second optical light path which may propagate from the reflective element 330, through the optical elements and the display layer 325, to the sensor array 320. In FIG. 3, the display layer 325 may be used as the light source for the imaging on the mobile device screen and also as the light source for the sensor array. In some examples, the display layer 325 may be an organic light emitting diode (OLED). The display layer 325 may emit randomly polarized light along the first optical path and to the first optical retardance element 305, which may be a quarter-wave retarder. The randomly polarized light may pass through the first optical retardance element 305 and randomly polarized light may exit the first optical retardance element 305. In some examples, one or more quarter-wave retarder films may be used for the first optical retardance element 305. By employing multiple quarter-wave retarder films, the layer may become achromatized, thus providing consistent performance across multiple wavelengths.

The randomly polarized light may then propagate along the first optical path to the polarization element 310. The polarization element 310 may be a linear polarizer and may linearly polarize the randomly polarized light as it passes through the polarization element 310. In some examples, the linear polarizer may be a polyvinyl alcohol (PVA) film. The light may be horizontally linearly polarized, vertically linearly polarized, linearly polarized at a 45 degree angle, or any other appropriate angle of linear polarization. In some examples, the absorption of the polarization element 310 may be 45 degrees to the horizontal axis due to the generally vertical transmission axis of sunglasses. Even though the polarization element 310 may prevent some of the light from passing through the layer, the polarization element 310 may mitigate cross-contamination of the display illumination with undesirable internal reflections and backscattered light. Mitigating the cross contamination of the display illumination will be discussed in further detail herein. The linearly polarized light may then propagate along the first optical path to the second optical retardance element 315.

The second optical retardance element 315 may receive the linearly polarized light and may depolarize the light or randomly polarize the light. In some examples, the second optical retardance element 315 may be a depolarization layer and/or may be a high retardance film. In some examples, the high retardance film may be polyethylene terephthalate (PET), polyethylene naphthalate (PEN), or any other appropriate polyester film. The depolarization layer may also be a film such as a diffuser. In some examples, the second optical retardance element 315 may be any film or layer which may depolarize the light before the light passes through the cover glass of the mobile device and is observed by a user with polarized eyewear.

Additionally, the second optical retardance element 315 may have a retardance value, Re, of greater than 1000 nanometers and in some cases may have a retardance value, Re, equal to or greater than 8000 nanometers. The retardance value of 8000 or greater nanometers or more may reduce the color shift between landscape and portrait modes of the mobile device. Generally, at a high retardance value of 8000 nanometers to 10,000 nanometers or more, the intensity dependence on wavelength may be mitigated such that the intensity may appear averaged across a range of wavelengths. Further, light output from a high retardance film with a value in the range of 8000 nanometers to 10,000 nanometers (or more) may have a different polarization state at different wavelengths. Accordingly, a user may view the mobile device screen while wearing polarized eyewear and may not view color error or screen discoloration when rotating the mobile device. The second optical retardance element 315 may provide randomly polarized light to the reflective element 330 and in some cases to the finger of a user which may be touching the reflective element 330. In some examples, the second optical retardance element 315 may have a thickness in the approximate range of four to seven microns. Using a high retardance film with this thickness may allow the high retardance film to be used in mobile devices while maintaining the form factor of the mobile device. For example, a high retardance film with a thickness in the approximate range of four to seven microns may be used in a smart phone or tablet while maintaining approximately the same thickness of the smart phone or tablet. By contrast, a thicker film, such as greater than approximately ten microns, when used in any mobile device, may cause the mobile device to become thicker overall and change the overall aesthetics of the mobile device, its portability, grip, form factor, and the like.

The reflective element 330 may reflect the received randomly polarized light and the reflected light may also be randomly polarized. The light reflected from the reflective element 330 may propagate along the second optical path from the reflective element 330 back towards the second optical retardance element 315 or high retardance film. In some examples, the reflective element 330 may be a cover glass and may be a material such as sapphire. Further, a user may touch the cover glass with a finger and the light may pass through the cover glass to reflect off the finger of the user, back through the cover glass, and propagate along the second optical path back towards the second optical retardance element 315.

The randomly polarized light, which may be reflected from either one or both of the reflective element 330 and/or a user's finger, may pass through the second optical retardance element 315. The light may still be randomly polarized after passing through the second optical retardance element 315 and may be provided to the polarization element 310. Because the light provided to the polarization element 310 is randomly polarized, at least some of the light may pass through the polarization element 310. In some examples, the polarization element 310 may linearly polarize the light when the light passes through the polarization element 310 and the linearly polarized light may propagate along the second optical path to the first optical retardance element 305 which may be a quarter-wave plate.

The first optical retardance element 305 may circularly polarize the received linearly polarized light when the light passes through the quarter-wave plate. The circularly polarized light may be either right circularly polarized or left circularly polarized depending on the orientation of the axis of the quarter-wave plate. The circularly polarized light may then propagate through the display layer 325 which may be an OLED and to the sensor array 320. In some examples, the sensor array may be a micro lens array. The light sensed by the sensor array may be used to determine physiological or biometric data of the user. Further, in some examples, the optical system 300 may include a narrow field of view collimator between the sensor array and the OLED.

In some circumstances, light may be reflected from the sensor array back towards the display layer 325, but the reflected light may be circularly polarized. In one example, the light incident on the sensor array 320 may be right circularly polarized and the light reflected off of the sensor array may change handedness and become left circularly polarized light. Although this light may pass through the display layer 325 and the first optical retardance element 305, which in some examples may be a quarter-wave plate, the light may not pass through the polarization element 310. By stopping the light at the polarization element 310, the quality of the image on the mobile device screen may be better due to the mitigated cross-contamination of light emitted from the display layer 325 and the circularly polarized light reflected off the sensor array 320.

Figure 4:
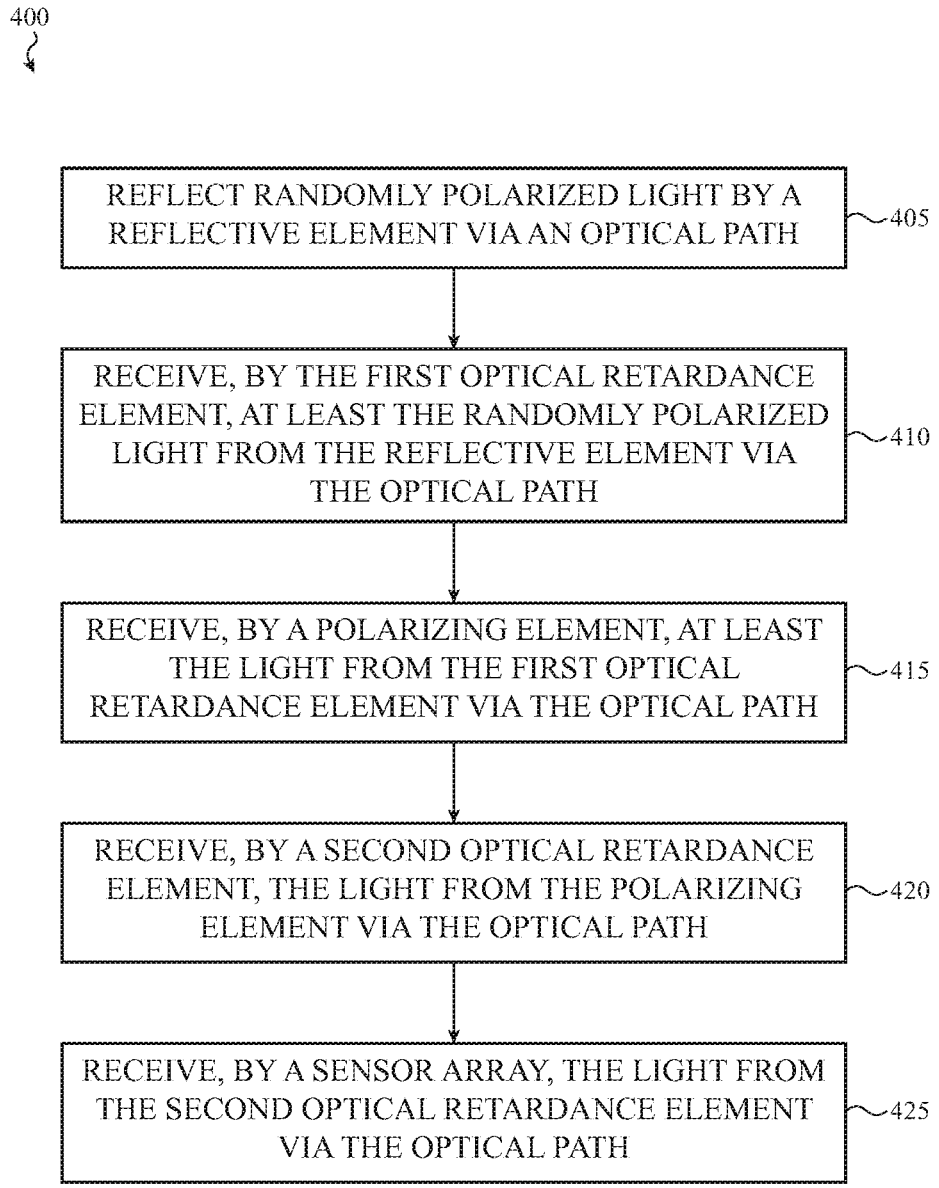
FIG. 4 illustrates an example of a process flow.

FIG. 4 illustrates an example process flow 400. In some examples, the process flow 400 depicted in FIG. 4 may include additional processes not depicted in FIG. 4, or may exclude some of the processes included in FIG. 4. Further, the processes of FIG. 4 are ordered for purposes of discussion, but may, in some examples, be performed in a different order. In the example of FIG. 4, the process flow 400 may include a light propagation path through a sensing device.

In FIG. 4 and at 405, a reflective element may be configured to reflect randomly polarized light toward a first optical retardance element via an optical path. The randomly polarized light may be directed to the reflective element by a display layer, via an optical stack, and the display layer may function as a light source for both the imaging of the display and as the light source for a sensor array. In some examples, the reflective element may be a cover glass of a mobile device and may be sapphire and the reflective element may be partially transmissive and reflective depending on a number of factors including the angle of incidence. Additionally, light may be reflected by a finger of a user touching the reflective element. The light from the reflective element and the finger of the user may be reflected and/or backscattered. Further, the randomly polarized light incident on the reflective element may also pass through the reflective element to provide an image on the mobile device screen. Although an optical path is described with respect to FIG. 4, there may be more than one optical path in the optical system. Further, and for discussion purposes only, the paths may be referred to as an optical path, a first optical path, and a second optical path, where any of these paths may be used to describe the propagation of light in either direction of the optical system and the terms may be used according to which element is being initially introduced in the discussion, thus affecting the description of which direction the light may be propagating through the optical system.

At 410, the first optical retardance element may be configured to receive at least the randomly polarized light from the reflective element via the optical path. In some examples, the first optical retardance element may be a high retardance film. The high retardance film may have a retardance value of greater than 1000 nanometers, and in some cases may have a retardance value equal to or greater than 8000 nanometers. High retardance film having retardance values of 8000 nanometers to 10,000 nanometers, or more, may reduce the color shift between landscape and portrait modes of the mobile device. With high retardance values, the intensity dependence on wavelength may be mitigated such that the intensity may appear averaged across a range of wavelengths, thus reducing the color shift. In some examples, the first optical retardance element may be a PET film, a PEN film, or any other appropriate polyester film.

At 415, a polarizing element may be configured to receive at least the light from the first optical retardance element via the optical path. The polarizing element may be a linear polarizer and may linearly polarize the received randomly polarized light. In some examples, the linear polarizer absorption may be approximately 45 degrees to the horizontal axis.

At 420, a second optical retardance element may receive the light from the polarizing element via the optical path. In some examples, the second optical retardance element may be a quarter-wave plate. The received light from the polarizing element may be linearly polarized light and the quarter-wave plate may circularly polarize the light. The handedness of the circularly polarized light, for example, right circularly polarized light or left circularly polarized light, may depend on the orientation of the axis of the second optical retardance element. In some examples, the second optical retardance element may be a quarter-wave plate and may be a cyclo olefin polymer (COP) film.

At 425, a sensor array may receive the light from the second optical retardance element via the optical path. The received light from the second optical retardance element may originate at the display layer adjacent to the sensory array and the light may propagate through the first optical retardance element, the polarizing element and the second optical retardance element in two different directions before reaching the sensor array.

Figure 5:
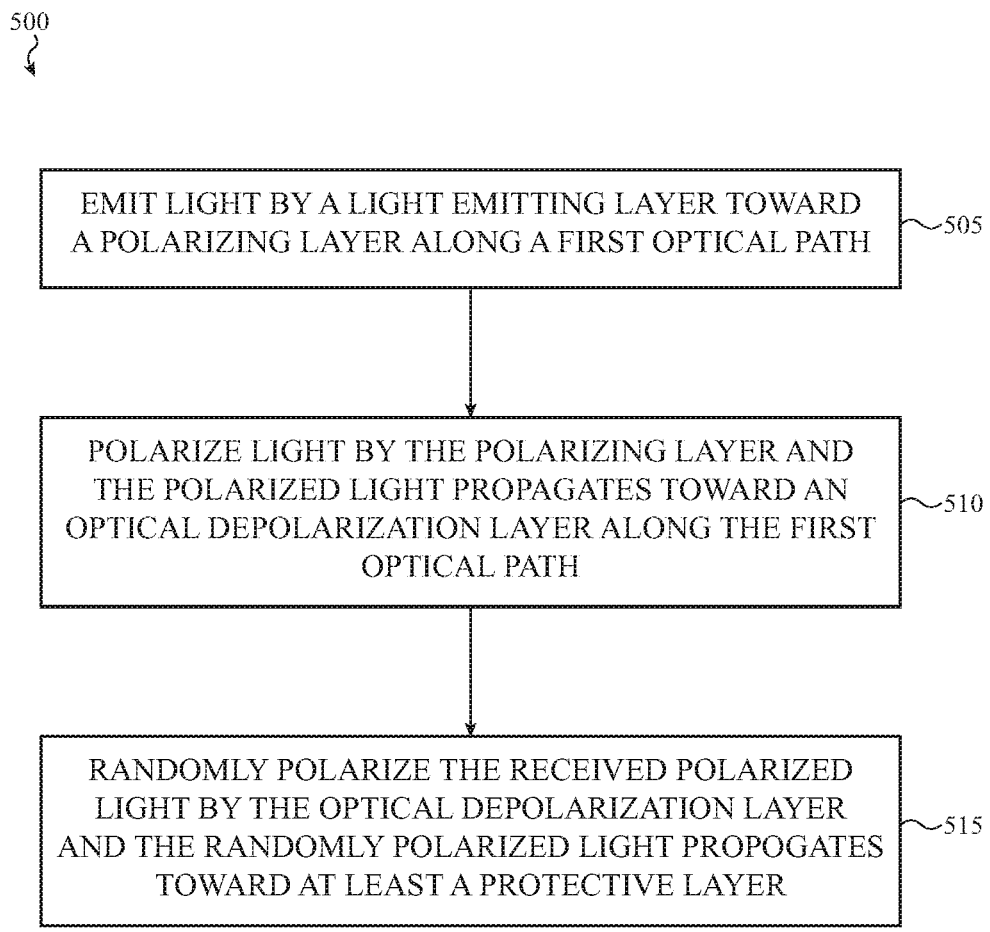
FIG. 5 illustrates an example of a process flow.

FIG. 5 illustrates an example process flow 500. In some examples, the process flow 500 depicted in FIG. 5 may include additional processes not depicted in FIG. 5, or may exclude some of the processes included in FIG. 5. Further, the processes of FIG. 5 are ordered for purposes of discussion, but may, in some examples, be performed in a different order. In the example of FIG. 5, the process flow 500 may include a light propagation path through a sensing device.

In FIG. 5 and at 505, a light emitting layer may emit light toward a polarizing layer along a first optical path. The light emitting layer may be a display layer and in some examples may be an OLED. The light emitting layer may provide light for imaging on the screen of the mobile device and also may be the light source for the sensor array. The light emitting layer may emit randomly polarized light which may propagate to the optical elements described herein.

At 510, a polarizing layer may receive the randomly polarized light from the light emitting layer and may polarize the received light. The polarizing layer may be a linear polarizer and may linearly polarize the light. The linearly polarized light may propagate toward an optical depolarization layer along the first optical path. The linearly polarized light may be horizontally linearly polarized, vertically linearly polarized, linearly polarized at a 45 degree angle, or any other appropriate angle of linear polarization. In some examples, the absorption of the polarizing layer may be 45 degrees to the horizontal axis. Even though the polarizing layer may prevent some of the light from passing through the layer, the polarizing layer may mitigate cross-contamination of the display illumination with undesirable internal reflections and backscattered light. In some examples, the polarizing layer may be a PVA film. Additionally, the polarizing layer may at least partially mitigate, and in some cases eliminate, the ambient light which may enter the mobile device and reflect and/or scatter and cross-contaminate the imaging light from the display layer or OLED.

At 515, the optical depolarization layer may receive the linearly polarized light and may depolarize or randomly polarize the received linearly polarized light. The randomly polarized light may then propagate toward at least a protective layer. The optical depolarization layer may be a high retardance film with a retardance value of greater than 1000 nanometers, and in some examples, equal to or greater than 8000 nanometers, or equal to or greater than 10,000 nanometers. A retardance value equal to or greater than 8000 nanometers may reduce the color shift between landscape and portrait modes of the mobile device when viewed by a user with polarized eyewear. Generally, at a high retardance value of 8000 nanometers to 10,000 nanometers or more, the intensity dependence on wavelength may be mitigated such that the intensity may appear averaged across a range of wavelengths, thus reducing the appearance of a color shift.

In some examples, the protective layer may be a cover glass of the mobile device screen. The randomly polarized light propagating toward the protective layer or cover glass and may partially transmit through the cover glass for imaging on the mobile device screen and may partially reflect and/or backscatter back towards the optical depolarization layer. Because the light is randomly polarized, a view may be able to view the mobile device screen in any rotational position as discussed herein. In some examples, the randomly polarized light propagating toward the cover glass may also be incident on the finger of a user touching the cover glass and may reflect back through the cover glass and toward the optical depolarization element. The light reflecting and/or backscattering from the finger of the user may be used to determine physiological or biometric data of the user such as the fingerprint of the user. This data may be used to verify the identity of the user and unlock the mobile device or to verify the identity of the user to make a purchase, and so forth.

Figure 6:
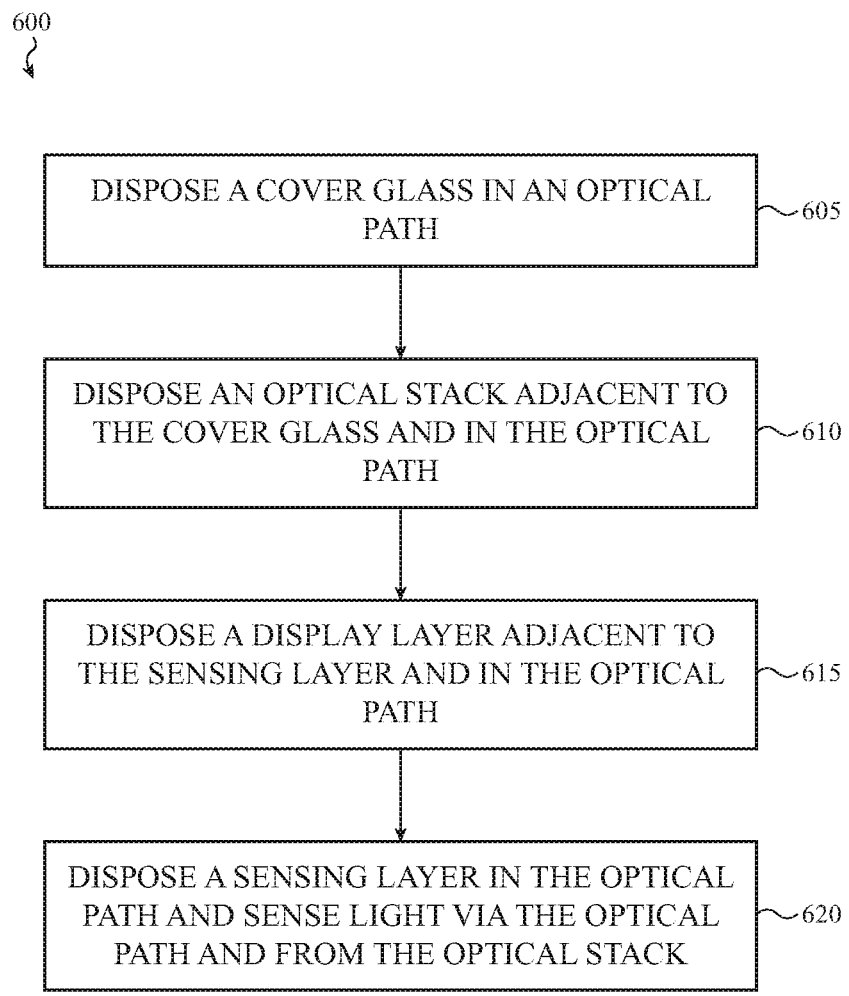
FIG. 6 illustrates an example of a process flow.

FIG. 6 illustrates an example process flow 600. In some examples, the process flow 600 depicted in FIG. 6 may include additional processes not depicted in FIG. 6, or may exclude some of the processes included in FIG. 6. Further, the processes of FIG. 6 are ordered for purposes of discussion, but may, in some examples, be performed in a different order. In the example of FIG. 6, the process flow 600 may include an optical stack of a mobile device.

In FIG. 6 and at 605, a cover glass may be disposed in an optical path. The cover glass may be sapphire and may be at least partially transmissive and partially reflective. At 610, an optical stack may be disposed adjacent to the cover glass and also in the optical path. The optical stack may include various optical elements such as a first optical retarder, a polarizer, and a second optical retarder, all of which may be disposed in the optical path. The first optical retarder may be a high retardance film and may be configured to randomly polarize any incoming light received from the cover glass and/or the finger of a user. In some examples, the high retardance film may have a retardance value equal to or greater than 8000 nanometers to mitigate the color shift when the rotational position of the mobile device changes and the user is wearing polarized eyewear. The light received at the first optical retarder may include light that may be reflected by a finger of a user touching the cover glass in addition to the reflected light from the cover glass. The light from the cover glass and the finger of the user may be reflected and/or backscattered. The polarizer may be a linear polarizer and may linearly polarize the randomly polarized light received from the first optical retarder. The linearly polarized light may then pass to the second optical retarder which may be a quarter-wave plate. The quarter-wave plate may circularly polarize the light.

At 615, the display layer may be disposed adjacent to a sensing layer and may also be in the optical path. The display layer may be the light source for imaging on the mobile device screen and also may be the light source for the sensor array. The circularly polarized light may pass through the display layer and may remain circularly polarized light. The circularly polarized light may then propagate to the sensing layer.

At 620, the sensing layer may be disposed in the optical path and may sense light via the optical path and from the optical stack via the display layer. The sensing layer may be a sensing device or a sensing array such as a micro lens array. The sensing layer may receive the circularly polarized light and may reflect circularly polarized light of the opposite handedness back toward the display layer and the optical stack. Once this opposite handed circularly polarized light encounters the polarizer layer, the light may not pass through the polarizer layer. In this way, the reflected and backscattered light which may cross-contaminate the imaging light emitted by the OLED may be mitigated and/or eliminated.

The described layouts and configurations of the mobile device in FIGS. 1A-6 have been for explanatory purposes. In alternative embodiments, the described embodiments may include a different combination or configuration of components, or may perform additional or alternative functions. The layouts and configurations described herein may be used as part of an electronic device, such as, in a watch, a biometric sensor, a laptop computer, a tablet, or in any other appropriate device.

Figure 7:
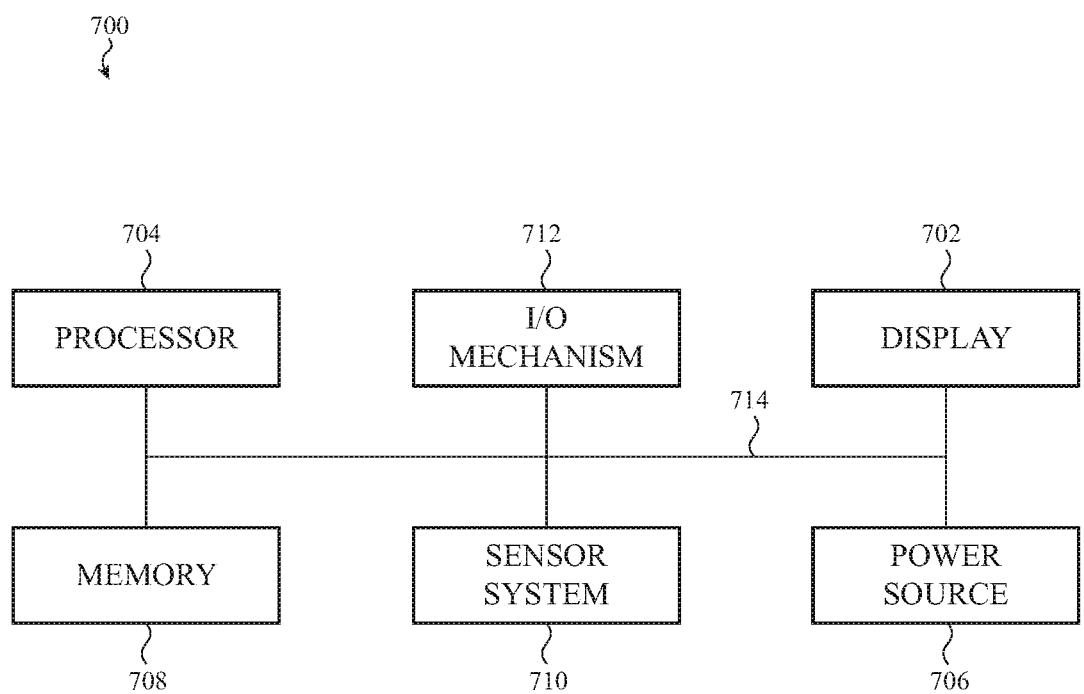
FIG. 7 illustrates a sample electrical block diagram of an electronic device.

FIG. 7 illustrates a sample electrical block diagram of an electronic device 700, and which may be the electronic device described with reference to FIGS. 1A-6. The electronic device 700 may include a display 702 (e.g., a light-emitting display on the front side of a mobile device), a processor 704, a power source 706, a memory 708 or storage device, a sensor system 710, and an input/output (I/O) mechanism 712 (e.g., an input/output device and/or input/output port). The processor 704 may control some or all of the operations of the electronic device 700. The processor 704 may communicate, either directly or indirectly, with substantially all of the components of the electronic device 700. For example, a system bus or other communication mechanism 714 may provide communication between the processor 704, the power source 706, the memory 708, the sensor system 710, and/or the I/O mechanism 712.

The processor 704 may be implemented as any electronic device capable of processing, receiving, or transmitting data or instructions. For example, the processor 704 may be a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or other suitably configured computing element or elements.

It should be noted that the components of the electronic device 700 may be controlled by multiple processors. For example, select components of the electronic device 700 may be controlled by a first processor and other components of the electronic device 700 may be controlled by a second processor, where the first and second processors may or may not be in communication with each other. In some embodiments, the processor 704 may include any of the processors and/or may be capable of any of the processing steps described herein.

The power source 706 may be implemented with any device capable of providing energy to the electronic device 700. For example, the power source 706 may be one or more batteries or rechargeable batteries. Additionally or alternatively, the power source 706 may be a power connector or power cord that connects the electronic device 700 to another power source, such as a wall outlet.

The memory 708 may store electronic data that may be used by the electronic device 700. For example, the memory 708 may store electrical data or content such as, for example, audio and video files, documents and applications, device settings and user preferences, timing signals, control signals, data structures or databases, image data, biometric data, or focus settings. The memory 708 may be configured as any type of memory. By way of example only, the memory 708 may be implemented as random access memory, read-only memory, Flash memory, removable memory, other types of storage elements, or combinations of such devices.

The electronic device 700 may also include a sensor system 710, which in turn includes one or more sensors positioned substantially anywhere on the electronic device 700, for example the back side of a wearable device. The sensor(s) may be configured to sense substantially any type of characteristic, such as but not limited to, pressure, light, touch, heat, movement, relative motion, biometric data, and so on. For example, the sensor(s) may include a heat sensor, a position sensor, a light or optical sensor, an accelerometer, a pressure transducer, a gyroscope, a magnetometer, a health monitoring sensor, and so on. Additionally, the one or more sensors may utilize any suitable sensing technology, including, but not limited to, capacitive, ultrasonic, resistive, optical, ultrasound, piezoelectric, and thermal sensing technology.

The I/O mechanism 712 may transmit and/or receive data from a user or another electronic device. An I/O device may include a display, a touch sensing input surface such as a track pad, one or more buttons (e.g., a graphical user interface "home" button), one or more cameras, one or more emitters and/or detectors (e.g., the wearable device with biometric sensors described with reference to FIGS. 1A-6 as described herein), one or more microphones or speakers, one or more ports such as a microphone port, and/or a keyboard. Additionally or alternatively, an I/O device or port may transmit electronic signals via a communications network, such as a wireless and/or wired network connection. Examples of wireless and wired network connections include, but are not limited to, cellular, Wi-Fi, Bluetooth, IR, and Ethernet connections.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

The present disclosure recognizes that personal information data, including the biometric data acquired using the presently described technology, can be used to the benefit of users. For example, the use of biometric authentication data can be used for convenient access to device features without the use of passwords. In other examples, user biometric data is collected for providing users with feedback about their health or fitness levels. Further, other uses for personal information data, including biometric data that benefit the user, are also contemplated by the present disclosure.

The present disclosure further contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure, including the use of data encryption and security methods that meets or exceeds industry or government standards. For example, personal information from users should be collected for legitimate and reasonable uses of the entity and not shared or sold outside of those legitimate uses. Further, such collection should occur only after receiving the informed consent of the users. Additionally, such entities should take any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices.

Despite the foregoing, the present disclosure also contemplates embodiments in which users selectively block the use of, or access to, personal information data, including biometric data. That is, the present disclosure contemplates that hardware and/or software elements can be provided to prevent or block access to such personal information data. For example, in the case of biometric authentication methods, the present technology can be configured to allow users to optionally bypass biometric authentication steps by providing secure information such as passwords, personal identification numbers (PINS), touch gestures, or other authentication methods, alone or in combination, known to those of skill in the art. In another example, users can select to remove, disable, or restrict access to certain health-related applications collecting users' personal health or fitness data.

What is claimed is:

1. A sensing device, comprising:
   a reflective element;
   a first optical retardance element configured to receive depolarized light from the reflective element along an optical path;
   a polarizing element configured to receive the light from the first optical retardance element along the optical path;
   a second optical retardance element configured to receive light from the polarizing element along the optical path, wherein the first optical retardance element has a higher retardance than the second optical retardance element; and
   a sensor array configured to receive light along the optical path and to receive the light after the light has passed through the second optical retardance element, wherein the sensor array is further configured to sense light used to determine physiological information of a user.

2. The sensing device of claim 1, wherein the first optical retardance element is configured to transmit the depolarized light to the reflective element along a second optical path.

3. The sensing device of claim 1, wherein the first optical retardance element is further configured to receive depolarized and reflected light from a finger of the user along the optical path.

4. The sensing device of claim 1, wherein the first optical retardance element has a retardance value greater than 1000 nanometers.

5. The sensing device of claim 1, wherein the first optical retardance element has a retardance value greater than 8000 nanometers.

6. The sensing device of claim 1, further comprising:
   an organic light emitting diode configured to receive light from the second optical retardance element and to transmit light to the sensor array.

7. The sensing device of claim 1, wherein the polarizing element is further configured to absorb light at a 45 degree angle to a horizontal axis.

8. The sensing device of claim 1, wherein the reflective element comprises sapphire.

9. The sensing device of claim 1, wherein the first optical retardance element is further configured to receive randomly polarized light from the polarizing element along a second optical path and to transmit the randomly polarized light toward a reflective element along the second optical path.

10. An optical system, comprising:
    a light emitting layer configured to emit light toward a polarizing layer along a first optical path;
    the polarizing layer configured to polarize light and transmit the polarized light toward an optical depolarization layer along the first optical path; and
    the optical depolarization layer configured to randomly polarize the polarized light received from the polarizing layer and transmit the randomly polarized light toward at least a protective layer along the first optical path, wherein the protective layer is configured to partially reflect the randomly polarized light to the optical depolarization layer.

11. The optical system of claim 10, further comprising a sensor array configured to receive light from the optical depolarization layer along a second optical path, wherein the received light is used for determining physiological information of a user.

12. The optical system of claim 10, wherein the optical depolarization layer has a retardance of greater than 8000 nanometers.

13. The optical system of claim 10, further comprising an optical retardance layer disposed between the light emitting layer and the polarizing layer.

14. The optical system of claim 10, wherein the optical depolarization layer is configured to receive reflected randomly polarized light from a finger of a user and along a second optical path.

15. The optical system of claim 14, wherein the polarizing layer is configured to receive randomly polarized light from an optical retardance layer along the second optical path.

16. The optical system of claim 14, wherein the light emitting layer is an organic light emitting diode configured to emit light, wherein the emitted light is used for determining physiological information of a user.

17. The optical system of claim 10, wherein the optical depolarization layer is at least one of polyethylene terephthalate (PET) or polyethylene naphthalate (PEN).

18. A mobile device, comprising:
    a cover glass disposed in an optical path;
    an optical stack adjacent to the cover glass and disposed in the optical path comprising:
      a first optical retarder disposed in the optical path and configured to randomly polarize light;
      a polarizer disposed in the optical path; and
      a second optical retarder disposed in the optical path;
    a display layer adjacent to a sensing layer and disposed in the optical path; and
    the sensing layer disposed in the optical path and configured to sense light received in the optical path, the sensing layer further configured to use the sensed light for determining physiological information of a user.

19. The mobile device of claim 18, wherein the first optical retarder is configured to receive polarized light from the polarizer and to randomly polarize the received polarized light.

20. The mobile device of claim 18, wherein the first optical retarder has a retardance greater than 8000 nanometers.

\* \* \* \* \*